(12) United States Patent
Gao et al.

(10) Patent No.: US 11,778,732 B2
(45) Date of Patent: Oct. 3, 2023

(54) SIGNAL TRANSMISSION CIRCUIT PACKAGING STRUCTURE

(71) Applicant: LeRain Technology Co., Ltd., New Taipei (TW)

(72) Inventors: Miaobin Gao, New Taipei (TW); Chia-Chi Hu, New Taipei (TW)

(73) Assignee: LERAIN TECHNOLOGY CO., LTD., New Taipei (TW)

( * ) Notice: Subject to any disclaimer, the term of this patent is extended or adjusted under 35 U.S.C. 154(b) by 220 days.

(21) Appl. No.: 17/505,904

(22) Filed: Oct. 20, 2021

(65) Prior Publication Data
US 2022/0376443 A1 Nov. 24, 2022

(30) Foreign Application Priority Data
May 21, 2021 (TW) .................................. 110118531

(51) Int. Cl.
*H05K 1/02* (2006.01)
*H05K 1/11* (2006.01)
*H04B 1/40* (2015.01)
(52) U.S. Cl.
CPC ........... *H05K 1/0228* (2013.01); *H05K 1/111* (2013.01); *H04B 1/40* (2013.01)
(58) Field of Classification Search
None
See application file for complete search history.

(56) References Cited

U.S. PATENT DOCUMENTS

| 6,770,493 | B2 * | 8/2004 | Baker | H05K 1/029 257/E23.079 |
| 10,595,394 | B1 * | 3/2020 | Kim | H05K 1/113 |
| 2004/0084783 | A1 * | 5/2004 | Baker | H01L 23/50 257/E23.079 |
| 2016/0095216 | A1 * | 3/2016 | Nagai | H05K 1/0313 174/250 |

* cited by examiner

*Primary Examiner* — Hoa C Nguyen
*Assistant Examiner* — John B Freal
(74) *Attorney, Agent, or Firm* — Muncy, Geissler, Olds & Lowe, P.C.

(57) ABSTRACT

A signal transmission circuit packaging structure is disclosed. The signal transmission circuit packaging structure includes a body, a main circuit unit, power pins, input pins, output pins, control pins and ground pins. The main circuit unit is arranged in the center of the body. The power pins are arranged in the center of the body. The input pins are arranged at a first side of the body and are electrically connected to the main circuit unit. The output pins are arranged at a side of the body opposite to the first side and are electrically connected to the main circuit unit. The control pins are arranged at a second side of the body and are electrically connected to the main circuit unit. The ground pins are arranged at corners of the body to separate the input pins, the output pins and the control pins.

7 Claims, 3 Drawing Sheets

US 11,778,732 B2

SIGNAL TRANSMISSION CIRCUIT PACKAGING STRUCTURE

BACKGROUND OF THE INVENTION

Field of the Invention

The present invention relates to a signal transmission circuit packaging structure, and more particularly to a signal transmission circuit packaging structure capable of separating different high-speed signal transmission paths so as to prevent crosstalk.

Description of the Prior Art

Data communication and transmission rates continue to increase with further advances in technology. High-speed data transmission is demanded by both communication devices and data server devices. Regarding the current USB 3.0, the expected transmission rate of USB 3.0 can reach as high as 5 Gbps (625 MB/s). In the prior art, a signal repeater integrated circuit (IC) is used in USB 3.0 to enhance signal quality at a high-speed interface. Thus, in such a high-speed transmission environment, the design of a packaging structure of the repeater IC is a critical factor in the high-speed transmission of data. A poorly designed repeater may cause issues of crosstalk and degrade signal quality.

Therefore, it is necessary to create a novel signal transmission circuit packaging structure for solving the issues of the prior art.

SUMMARY OF THE INVENTION

The primary object of the present invention is to provide a signal transmission circuit packaging structure which is capable of separating different high-speed signal transmission paths so as to prevent crosstalk.

To achieve the object described above, a signal transmission circuit packaging structure of the present invention includes a body, a main circuit unit, a plurality of power pins, a plurality of input pins, a plurality of output pins, a plurality of control pins, and a plurality of ground pins. The body includes a first side and a second side, wherein the first side is adjacent to the second side. The main circuit unit is arranged in the center of the body. The plurality of power pins are arranged in the center of the body and supply a power signal to the main circuit unit. The plurality of input pins are arranged at the first side of the body and are electrically connected to the main circuit unit. The plurality of output pins are arranged at a side of the body opposite to the first side and are electrically connected to the main circuit unit. The plurality of control pins are arranged at the second side and between the center of the body and the second side, and the plurality of control pins are electrically connected to the main circuit unit. The plurality of ground pins are arranged at corners of the body and arranged between the plurality of input pins, the plurality of output pins, and the plurality of control pins so as to separate the plurality of input pins, the plurality of output pins, and the plurality of control pins.

DETAILED DESCRIPTION OF THE EMBODIMENTS

Preferred specific embodiments are given below to better understand the technical contents of the present invention.

Figure 1:
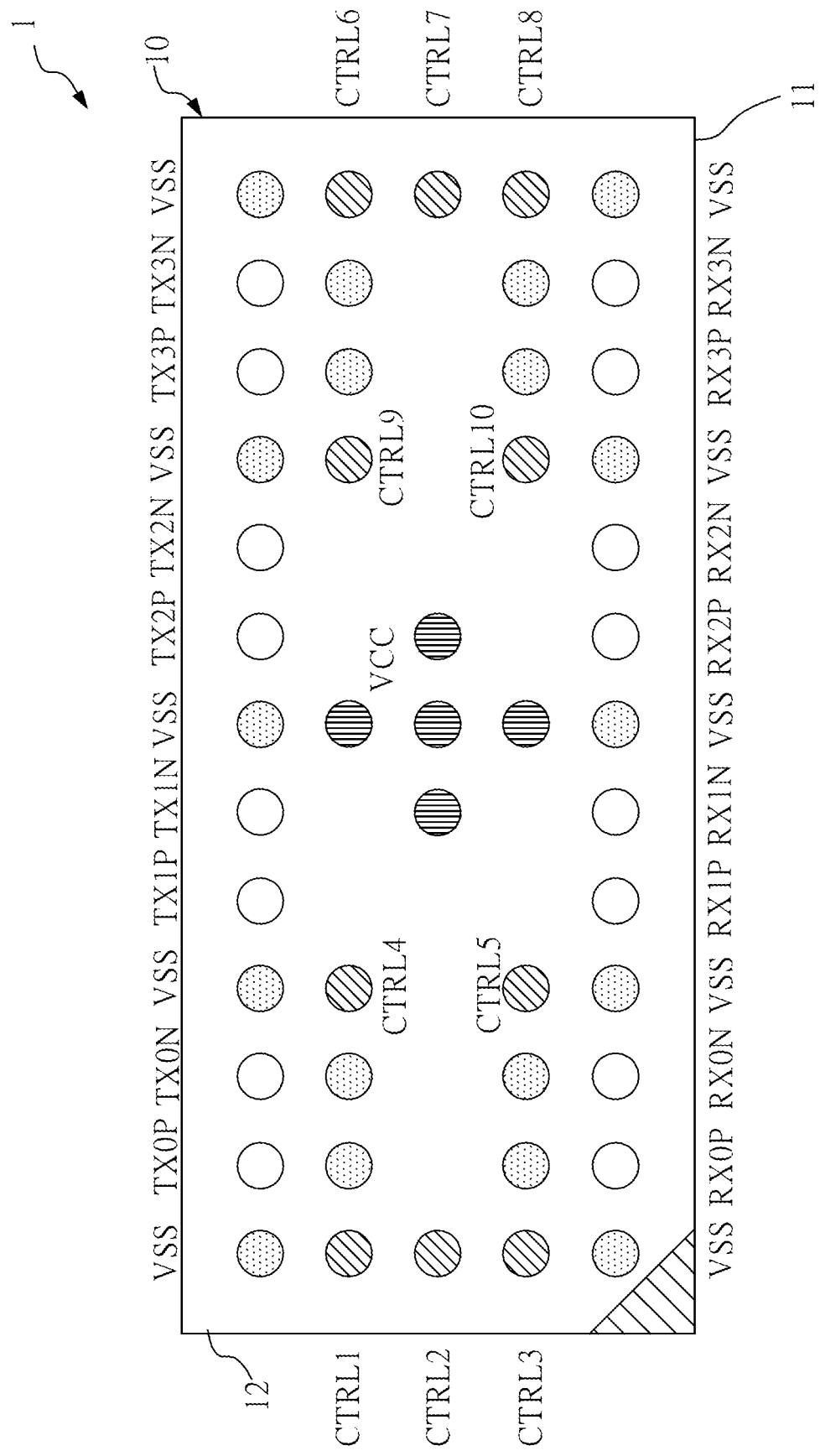
FIG. 1 is a schematic diagram of a pin layout of a signal transmission circuit packaging structure of the present invention.

Please refer to FIG. 1, which shows a schematic diagram of a pin layout of a signal transmission circuit packaging structure of the present invention.

In an embodiment of the present invention, a signal transmission packaging structure 1 is adapted to be electrically connected to other electronic modules so as to transmit electrical signals. The transmission mode of electrical signals may be implemented in the form of single-ended signals or differential signals; however, the present invention is not limited thereto. In embodiments of the present invention, descriptions are given in the form of differential signals. It should be noted that, although the terms "first" and "second" are used to describe various elements of the present invention, these terms are not to be construed as limitations of the elements. Such terms are used merely for differentiating one element from another element. For example, without departing from the scope of the various embodiments described, a first input pin may be referred to as a second input pin, and similarly, a second input pin may be referred to as a first input pin. Moreover, the first input pin and the second input pin are both input pins but are not the same input pin.

Figure 2:
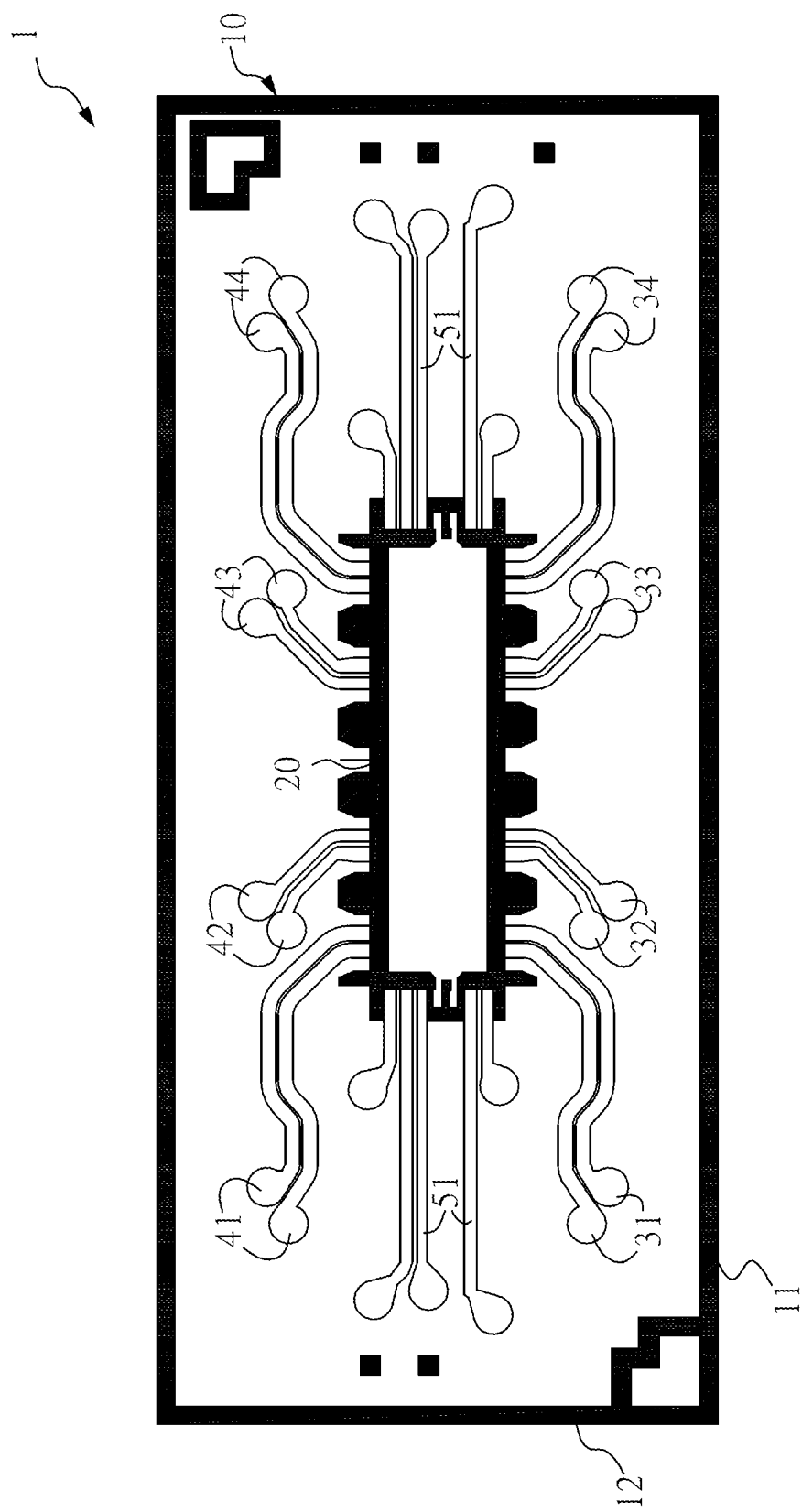
FIG. 2 is a schematic diagram of transmission channels of a signal transmission circuit packaging structure of the present invention.

The signal transmission circuit packaging structure 1 includes a body 10, a main circuit unit 20 (as shown in FIG. 2), a plurality of power pins Vcc, a plurality of input pins, a plurality of output pins, a plurality of control pins and a plurality of ground pins Vss. The body 10 may be a single-layer or multi-layer circuit board and includes a first side 11 and a second side 12, wherein the first side 11 is adjacent to the second side 12. The main circuit unit 20 is arranged in the center of the body 10 and may be arranged on a layer of the circuit board other than a layer which other pins are connected to. The main circuit unit 20 is a repeater circuit; however, the present invention is not limited thereto. The plurality of power pins Vcc are arranged in the center of the body 10 and supply a power signal to the main circuit unit 20. The plurality of input pins may be first input pins RX0P and RX0N, second input pins RX1P and RX1N, third input pins RX2P and RX2N, and fourth input pins RX3P and RX3N, and the plurality of input pins are arranged at the first side 11 of the body 10 and electrically connected to the main circuit unit 20. The plurality of output pins may be first output pins TX0P and TX0N, second output pins TX1P and TX1N, third output pins TX2P and TX2N, and fourth output pins TX3P and TX3N, and the plurality of output pins are arranged at a side opposite to the first side 11 of the body 10 and electrically connected to the main circuit unit 20. The transmission signal is inputted from the plurality of input pins to the main circuit unit 20 and then transmitted to the plurality of output pins. The first input pins RX0P and RX0N, the second input pins RX1P and RX1N, the third input pins RX2P and RX2N, and the fourth input pins RX3P and RX3N are in an arrangement of mirroring or symmetrical to the first output pins TX0P and TX0N, the second output pins TX1P and TX1N, the third output pins TX2P and TX2N, and the fourth output pins TX3P and TX3N at opposite sides of the body 10, and all are arranged at edges of the body 10 such that the main circuit unit 20 can be connected with reduced transmission paths to external electronic modules.

The plurality of control pins CTRL1, CTRL2, CTRL3, CTRL6, CTRL7 and CTRL8 are arranged at the second side of the body, and the remaining control pins CTRL4, CTRL5, CTRL9 and CTRL10 are arranged in positions between the center of the body and the second side and closer to the main circuit unit 20. All the plurality of control pins CTRL1 to CTRL10 are electrically connected to the main circuit unit 20. The plurality of control pins CTRL1 to CTRL10 may serve for gain or equalization control of the main circuit unit 20 or as test pins; however, the present invention does not pose any limitations on the functions of the plurality of control pins CTRL1 to CTRL10. The plurality of ground pins Vss are arranged at corners of the body 10 and arranged between the plurality of input pins RX0P to RX3N and the plurality of output pins TX0P to TX3N so as to separate the plurality of input pins RX0P to RX3N, the plurality of output pins TX0P to TX3N and the plurality of control pins CTRL1 to CTRL10.

Then refer to FIG. 2, which shows a schematic diagram of transmission channels of a signal transmission circuit packaging structure of the present invention.

The first input pins RX0P and RX0N, the second input pins RX1P and RX1N, the third input pins RX2P and RX2N, and the fourth input pins RX3P and RX3N are electrically connected to the main circuit unit 20 through a first high-speed input channel 31, a second high-speed input channel 32, a third high-speed input channel 33 and a fourth high-speed input channel 34, respectively, and then electrically connected to the first output pins TX0P and TX0N, the second output pins TX1P and TX1N, the third output pins TX2P and TX2N, and the fourth output pins TX3P and TX3N through a first high-speed output channel 41, a second high-speed output channel 42, a third high-speed output channel 43 and a fourth high-speed output channel 44, respectively. The first high-speed input channel 31, the second high-speed input channel 32, the third high-speed input channel 33 and the fourth high-speed input channel 34 are in an arrangement of mirroring or symmetrical to the first high-speed output channel 41, the second high-speed output channel 42, the third high-speed output channel 43 and the fourth high-speed output channel 44. All the plurality of control pins CTRL1 to CTRL10 are electrically connected to the main circuit unit 20 through the plurality of low-speed transmission channels 51 so as to transmit control signals to the main circuit unit 20. It should be noted that, although the terms "the plurality of input pins RX0P to RX3N" and "plurality of output pins TX0P to TX3N" are used to describe various pins of the present invention, these terms are not to be construed as limitations of the pins. For example, given the permission of the functions of the man circuit unit 20, the transmission path of the electrical signal may be opposite; the transmission path may be inputted from the first output pins TX0P and TX0N and outputted from the first input pins RX0P and RX0N so as to achieve the function of bi-directional signal transmission.

Figure 3:
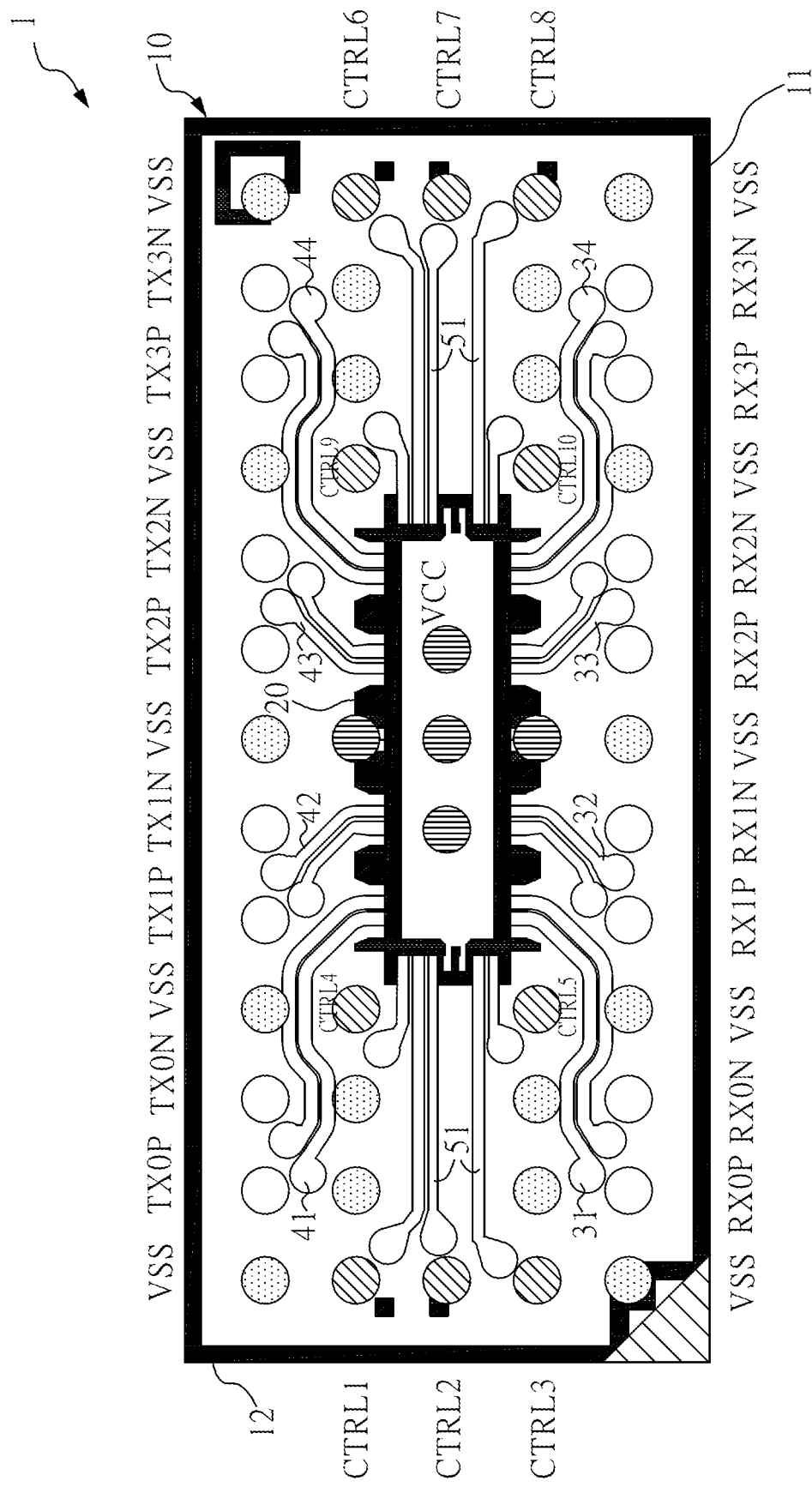
FIG. 3 is a schematic diagram that combines a pin layout and the transmission channels in a signal transmission circuit packaging structure of the present invention.

Then refer to FIG. 3, which shows a combination schematic diagram of a pin layout and the transmission channels in a signal transmission circuit packaging structure of the present invention.

As shown in FIG. 3, the plurality of input pins RX0P to RX3N, the plurality of output pins TX0P to TX3N and the plurality of control pins CTRL0 to CTRL10 are all separated by the ground pins Vss. Moreover, the high-speed input channels 31 to 34 and the high-speed output channels 41 to 44 are not close to any of the plurality of low-speed transmission channels 51 and are mutually separated by certain distances. As a result, the high-speed transmission signals will not experience interference due to crosstalk of low-speed control signals, thus providing optimal high-speed signal quality.

It is known from the description above that the signal transmission circuit packaging structure 1 of the present invention is capable of reducing distances of signal transmission, the signal attenuation, the number of vias in a circuit board and complications in circuit layout, as well as preventing issues of crosstalk and degraded signal quality, and the design of the present invention is obviously superior to designs of the prior art.

It should be noted that the embodiments given above are examples of the present invention rather than limitations of the present invention. Any variation that does not depart from the fundamental structure of the invention is to be encompassed within the scope of protection in accordance with the broadest interpretation of the appended claims.

What is claimed is:

1. A signal transmission circuit packaging structure, comprising:
    a body, comprising a first side and a second side, the first side being adjacent to the second side;
    a main circuit unit, arranged in a center of the body;
    a plurality of power pins, arranged in the center of the body and supplying a power signal to the main circuit unit;
    a plurality of input pins, arranged at the first side of the body and electrically connected to the main circuit unit;
    a plurality of output pins, arranged at a side of the body opposite to the first side and electrically connected to the main circuit unit;
    a plurality of control pins, arranged at the second side of the body and between the center of the body and the second side, and electrically connected to the main circuit unit; and
    a plurality of ground pins, arranged at corners of the body and arranged between the plurality of input pins, the plurality of output pins and the plurality of control pins, so as to separate the plurality of input pins, the plurality of output pins and the plurality of control pins.

2. The signal transmission circuit packaging structure according to claim 1, wherein the plurality of input pins are in an arrangement of mirroring or symmetrical to the plurality of output pins at edges of the body.

3. The signal transmission circuit packaging structure according to claim 2, wherein the plurality of input pins are electrically connected to the main circuit unit through a plurality of high-speed input channels, and then electrically connected to the plurality of output pins through a plurality of high-speed output channels.

4. The signal transmission circuit packaging structure according to claim 3, wherein the plurality of high-speed input channels are in an arrangement of mirroring or symmetrical to the plurality of high-speed output channels.

5. The signal transmission circuit packaging structure according to claim 4, wherein the plurality of control pins are electrically connected to the main circuit unit through the plurality of low-speed transmission channels.

6. The signal transmission circuit packaging structure according to claim 5, wherein the plurality of low-speed transmission channels are separated by a predetermined distance from the plurality of high-speed input channels and the plurality of high-speed output channels.

7. The signal transmission circuit packaging structure according to claim 1, wherein the main circuit unit is a repeater circuit.

\* \* \* \* \*